United States Patent [19]
Ikemizu et al.

[11] Patent Number: 6,097,085
[45] Date of Patent: Aug. 1, 2000

[54] ELECTRONIC DEVICE AND SEMICONDUCTOR PACKAGE

[75] Inventors: Morihiko Ikemizu, Yokohama; Nobuaki Oie, Ebina; Ken Iwasaki, Yokohama, all of Japan

[73] Assignee: Kabushiki Kaisha Toshiba, Kawasaki, Japan

[21] Appl. No.: 09/140,541

[22] Filed: Aug. 26, 1998

[30] Foreign Application Priority Data

Aug. 29, 1997 [JP] Japan .................................. 9-233695
Jul. 17, 1998 [JP] Japan .................................. 10-204002

[51] Int. Cl.$^7$ .......................... H01L 23/02; H01L 23/48; H01L 23/52; H01L 29/40
[52] U.S. Cl. .......................... 257/678; 257/787; 257/793; 257/783; 257/693; 257/706; 257/707
[58] Field of Search .................................. 257/747, 729, 257/669, 678, 787, 793, 783, 693, 706, 707

[56] References Cited

U.S. PATENT DOCUMENTS

| | | | |
|---|---|---|---|
| 5,760,465 | 6/1998 | Alcoe et al. | 257/669 |
| 5,835,355 | 11/1998 | Dordi | 361/760 |
| 5,900,312 | 5/1999 | Sylvester | 428/322.7 |
| 5,925,934 | 7/1999 | Lim | 257/778 |

OTHER PUBLICATIONS

K. Iwasaki et al., "Thermal Fatigue Analysis for Solder Bump in BGA Packages", Advances in Electronic Packaging, vol. 19–2 (1997).

Primary Examiner—Mahshid Saadat
Assistant Examiner—Jhihan B. Clark
Attorney, Agent, or Firm—Finnegan, Henderson, Farabow, Garrett & Dunner, L.L.P.

[57] ABSTRACT

The electronic device has a structure that a semiconductor package is mounted on a mother board. To relieve stress caused by cyclic thermal load and applied to solder bumps that are electrically and mechanically connect the semiconductor package and the mother board, a shape-holding plate (stiffener) adhered to a wiring film is composed of a metal with a thermal expansion coefficient of $13 \times 10^{-6}$ to $17 \times 10^{-6}$ almost close to that of a glass-epoxy wiring substrate as the mother board. Examples of the metal are 25Cr-20Ni stainless steel or copper alloy containing 0.01 to 0.03% by weight of Zr.

11 Claims, 2 Drawing Sheets

ELECTRONIC DEVICE AND SEMICONDUCTOR PACKAGE

BACKGROUND OF THE INVENTION

1. Field of the Invention

The present invention relates to an electronic device, in particular, to an electronic device of which a semiconductor package is mounted on a wiring substrate as a mother board with high reliability. In addition, the present invention relates to a semiconductor package, in particular, to a semiconductor package that is mounted on a wiring substrate as a mother board with high reliability.

2. Description of the Related Art

To decrease the size of an electronic device and compact circuit structure thereof, a semiconductor element (for example, an IC chip) is mounted on a multi-layered wiring substrate composed of ceramics or the like. The mounted area is sealed with a metal cap or molding resin.

Particularly, in a semiconductor element such as a CPU that consumes a high power, a heat sink is disposed so as to give off heat from the element.

In addition, to reduce the cost of the fabrication of an electronic device and simplify the structure thereof, a TCP (tape carrier package) has been used. In the TCP, a semiconductor element is mounted on a carrier tape that has wirings such as inner leads. A shape-holding plate (referred to as stiffener) is disposed on the semiconductor element. In addition, a heat radiating cover is disposed on the stiffener. To allow the number of input/output terminals to be increased, the outer size to be decreased, and a semiconductor device to be easily mounted, solder balls or the like are disposed in a grid pattern on connecting pads that are external connecting terminals. This structure is referred to as ball grid array (BGA).

FIG. 4 is a perspective view showing an example of the structure of conventional tape-BGA type semiconductor package. In FIG. 4, reference numeral 1 is an insulating resin film having a device hall. An example of the insulating resin film 1 is a polyimide film. Reference numeral 2 is an inner lead disposed on one main face (for example, on the lower surface) of the insulating resin film 1. The inner lead 2 protrudes to a device hole. Many inner leads 2 are disposed corresponding to electrode pads of a semiconductor element. Wiring (not shown) such as signal lines is connected to the rear end of the inner leads 2. Connecting pads (not shown) as external connecting terminals are disposed on the edges of the relevant wirings. Reference numeral 3 is a semiconductor element disposed with face down in a device hole. Each electrode pads of the semiconductor element 3 are electrically connected to the edges of the relevant inner leads 2. Reference numeral 4 is a resin sealing layer that coats and seals a connecting area of the semiconductor element 3. Reference numeral 5 is a bump composed of for example a solder ball. Solder bumps 5 are disposed on the relevant connecting pads. Reference numeral 6 is a frame shape-holding plate (stiffener) adhered to the other main face (for example, the upper face in FIG. 4) of the insulating resin film 1 with an adhesive agent 7. Reference numeral 8 is a cover plate disposed on the other face of the stiffener 6 and the semiconductor element 3. The cover plate 8 has heat radiating characteristic and is adhered with an adhesive agent 9.

This semiconductor package is mounted on a wiring substrate of the host (mother board) and thereby an electronic device is structured. In other words, connecting pads are disposed on one main face of the mother board corresponding to external connecting terminals (connecting pads) of the semiconductor package. The connecting pads of the mother board and the external connecting terminals of the semiconductor package are connected with bumps such as solder balls 5.

However, in an electronic device with a semiconductor package, a stress due to a thermal load that is applied in fabrication process or in operation concentrates at the solder balls 5 that connect the external connecting terminals of the semiconductor package and the connecting pads of the mother board and thereby the semiconductor package warps.

In other words, as a mother board, a glass-epoxy wiring substrate of which glass cloths impregnated with epoxy resin and copper wiring layers are laminated is usually used. The average thermal expansion coefficient (TEC) of the wiring substrate is in the range from $13 \times 10^{-6}$ to $18 \times 10^{-6}$/°C. (/K) although it varies depending on the wiring density and the wiring direction.

On the other hand, since the stiffener 6 whose thickness is the largest in the semiconductor package shown in FIG. 4 (in other words, the stiffener 6 mainly affects TEC of the semiconductor package) is usually composed of stainless steel (for example, SUS 304 whose TEC is $17.3 \times 10^{-6}$), there is an inconsistency in physical property values between the semiconductor package and the mother board.

When the difference of the physical characteristics is large, since the outer lead portion of the QFP (Quad Flat Package) formed in a gull wing shape elastically deforms, it absorbs and relieves the distortion due to the concentrated stress. On the other hand, since the BGA type semiconductor package does not have a portion that absorbs and relieves such a distortion, the periodic temperature change causes the bumps such as solder balls 5 that connect the semiconductor package and the mother board to be repeatedly stressed. Thereby, the bumps are fatigued and broken.

FIG. 5 shows the structure of an electronic device of which a QFP is mounted on a glass-epoxy wiring substrate. Referring to FIG. 5, reference numeral 10 is a bed portion of a lead frame. 11a is an inner lead portion, and 11b is an outer lead portion. 12 is an semiconductor element, and 13 is a bonding wire that connects an electrode terminal (not shown) of the semiconductor element and the inner lead portion 11a. 14 is molding resin composed of epoxy resin, and 15 is a glass-epoxy wiring substrate as a mother board. 16 is a solder fillet that connects the outer lead portion 11b of the QFP to a predetermined wiring portion (not shown) of the glass-epoxy wiring substrate 15.

SUMMARY OF THE INVENTION

An object of the present invention is to provide an electronic device having high reliability of a connecting portion between a semiconductor package and a mother board. Another object of the present invention is to provide a semiconductor package that is mounted on a mother board so as to accomplish an electronic device with high reliability.

A first aspect of the present invention is an electronic device, comprising a wiring substrate having connecting terminals formed on one main face thereof, a semiconductor package having a wiring film having a device hole, external connecting terminals, and inner leads, the external connecting terminals and the inner leads being formed on one face thereof, the inner leads protruding to the device hole, a semiconductor element disposed in the device hole and electrically connected to the inner leads, and a shape-holding plate composed of a metal having a thermal expansion coefficient almost close to that of said wiring substrate, the shape-holding plate being disposed in a region that surrounds the device hole on the other main face of the wiring film, and bumps for electrically and mechanically connecting the external connecting terminals of said semiconductor package and the connecting terminals of said wiring substrate.

Thus, the shape-holding plate is composed of a material having TEC close to that of the wiring substrate.

The bumps that connect the external connecting terminals of the semiconductor package and the connecting terminals of the wiring substrate as a mother board may be ball shaped bumps composed of Pb-Sn solder or the like. The solder bumps are formed by placing shaped solder balls on the connecting pads as external connecting terminals of the wiring film and heating them (thus, the solder balls are re-flowed).

A covering member that has a heat radiating characteristic may be disposed outside the semiconductor element. Examples of the covering member are a plate composed of a metal such as copper or aluminum with high thermal conductivity, a plate composed of ceramics such as aluminum oxide or aluminum nitride, or a laminate thereof. The thickness, shape, and so forth of the covering member depend on the capacitance, heat emitting characteristic, and so forth of the semiconductor element.

The wiring substrate may be a glass-epoxy wiring substrate of which glass cloths impregnated with epoxy resin and copper wiring layers are laminated.

The shape-holding plate (stiffener) may be composed of a metal having TEC of $13 \times 16^{-6}$ to $17 \times 10^{-6}$ (/K) that is almost close to that ($13 \times 10^{-6}$ to $18 \times 10^{-6}$/K) of the glass-epoxy wiring substrate. Examples of the metal having TEC of $13 \times 10^{-6}$ to $17 \times 10^{-6}$/K are 25Cr-20Ni stainless steel (SUS 310S: TEC=$15.9 \times 10^{-6}$/K) and copper alloy containing 0.01 to 0.03% by weight of Zr (for example, CDA Alloy C15150, TEC=$16.7 \times 10^{-6}$/K). In particular, the thermal conductivity of CDA Alloy C15150 is as high as 15 to 20 W·m/K and has a high heat radiating characteristic. Thus, CDA Alloy C15150 is suitable for a structural material of the shape-holding plate. On the other hand, SUS 310S is easily obtained and relatively inexpensive and has a high corrosion resistance.

A second aspect of the present invention is an electronic device, comprising a wiring substrate having connecting terminals formed on one main face thereof, a semiconductor package having a wiring film having a device hole, external connecting terminals, and inner leads, the external connecting terminals and the inner leads being formed on one face thereof, the inner leads protruding to the device hole, a semiconductor element disposed in the device hole and electrically connected to the inner leads, and a covering member having a shape-holding characteristic composed of a metal, said covering member having a thermal expansion coefficient almost close to that of said wiring substrate, fully covering the outside of the semiconductor element, being adhered on the other main face of the wiring film, and bumps for electrically and mechanically connecting the external connecting terminals of said semiconductor package and the connecting terminals of said wiring substrate.

The covering member having the shape-holding characteristic is composed of a metal having TEC almost close to that of the wiring substrate.

The bumps that electrically and mechanically connect the external connecting terminals of the semiconductor package and the connecting terminals of the wiring board as a mother board may be ball shaped bumps composed of Pb-Sn solder bumps.

The wiring substrate may be a glass-epoxy wiring substrate. In addition, the covering member may be composed of a metal having TEC of $13 \times 16^{-6}$ to $17 \times 10^{-6}$ (/K). Examples of the metal having TEC in such a range are 25Cr-20Ni stainless steel (such as SUS 301 S) and copper alloy (such as CDA Alloy C15150).

A third aspect of the present invention is a semiconductor package, comprising a wiring film having a device hole, external connecting terminals, and inner leads, the external connecting terminals and the inner leads being formed on one face thereof, the inner leads protruding to the device hole, a semiconductor element disposed in the device hole and electrically connected to the inner leads, and a shape-holding plate composed of a metal having a thermal expansion coefficient of $13 \times 10^{-6}$ to $17 \times 10^{-6}$ (/K), the shape-holding plate being disposed in a region that surrounds the device hole on the other main face of said wiring film.

The shape-holding plate is composed of a metal having TEC of $13 \times 10^{-6}$ to $17 \times 10^{-6}$ (/K).

A fourth aspect of the present invention is a semiconductor package, comprising a wiring film having a device hole, external connecting terminals, and inner leads, the external connecting terminals and the inner leads being formed on one face thereof, the inner leads protruding to the device hole, a semiconductor element disposed in the device hole and electrically connected to the inner leads, and a covering member having a shape-holding characteristic composed of a metal, said covering member having a thermal expansion coefficient of $13 \times 10^{-6}$ to $17 \times 10^{-6}$ (/K), fully covering the outside of the semiconductor element, being adhered on the other main face of said wiring film.

The covering member having the shape-holding characteristic is composed of a metal having a thermal expansion coefficient of $13 \times 10^{-6}$ to $17 \times 10^{-6}$ (/K).

Examples of the metal that composes the shape-holding plate or the covering member having the shape-holding characteristic, the metal has TEC of $13 \times 10^{-6}$ to $17 \times 10^{-6}$ (/K), 25Cr-20Ni stainless steel (such as SUS 310S) and copper alloy (such as CDA Alloy C15150).

Ball-shaped bumps composed of Pb-Sn solder may be disposed on the external connecting terminals. With the solder bumps, the terminals of the semiconductor package and the connecting terminals of the mother board are electrically and mechanically connected.

In the semiconductor package and the electronic device according to the present invention, as the base material of the wiring film having a device hole, an insulating resin film such as a polyimide resin film can be used. The thickness of the insulating resin film is preferably in the range from 50 to 125 $\mu$m although it varies the type, shape, size, and so forth of the semiconductor package. The size and plane shape of the device hole depends on the size, shape, and so forth of the semiconductor element that is disposed therein.

Wirings and inner leads are disposed on one main face of the insulating resin film. The wirings are for example signal lines. One edge portion (end) of the inner lead protrudes to the device hole. The other end portion of the inner lead is connected to relevant signal lines. Connecting pad as external connecting terminals are disposed at end of the wirings. The wirings including the inner leads are composed of such as Cu, Cu-alloy, or Ni-alloy (for example, 42-alloy). The wirings are formed by deposit-patterning such a material on the insulating resin film, or photo-patterning Cu foil or such an alloy layer formed on one face of the insulating resin film. The pitch and arrangement of the inner leads depend on those of the electrode pads of the semiconductor element to be mounted on the wiring film.

The semiconductor element that is mounted on the wiring film is an element such as CPU, DSP, or a memory element (one of various types). It should be noted that the semiconductor element mounted on the wiring film is not limited to a chip type. The semiconductor element is disposed with face down in the device hole. The electrode pads composed of Al or the like are electrically connected to the edge portion of the relevant inner leads through gold bumps or the like. In addition, to mechanically protect the semiconductor element against outer moisture and impurities, the connecting area of the semiconductor element is coated and sealed with a resin layer. An example of the resin, epoxy resin or polysulfonic resin that is usually used for sealing a semiconductor element can be used.

In the electronic device according to the present invention, a shape-holding plate or a covering member having a shape-holding characteristic is composed of a material having TEC that is close to that of the mother board. Thus, since TEC of the entire package is approximately the same with TEC of the mother board, when the temperature periodically changes in the fabrication process or in operation, the stress does not concentrate at bumps such as solder balls that are connecting portions of the semiconductor package and the mother board. Thus, the distortion and fatigue breakdown due to the thermal load is prevented. Consequently, the reliability of the connection between the semiconductor package and the mother board is improved.

In addition, the metal that composes the shape-holding plate or the covering member with a shape-holding characteristic is superior to another rigid material in thermal conductivity, heat radiation, formability, workability, and flatness. Thus, even if the shape-holding plate skews or warps, it can be easily flattened. In addition, the material has higher material selectivity. In other words, a material with TEC that is the closest to that of the mother board can be selected from many metals. Thus, this metal is suitable for the material of the shape-holding plate. Consequently, an electronic device with excellent characteristics can be accomplished with high productivity Moreover, in the semiconductor package having a covering member with a shape-holding characteristic and the electronic device with said semiconductor package, the thickness of the package and the entire device can be decreased. In addition, the number of structural parts can be decreased. Furthermore, the housing member in a cap shape can be formed with a metal in a simple process.

These and other objects, features and advantages of the present invention will become more apparent in light of the following detailed description of a best mode embodiment thereof, as illustrated in the accompanying drawings.

DESCRIPTION OF PREFERRED EMBODIMENTS

Next, with reference to the accompanying drawings, embodiments of the present invention will be described.

(Embodiment 1)

Figure 1:
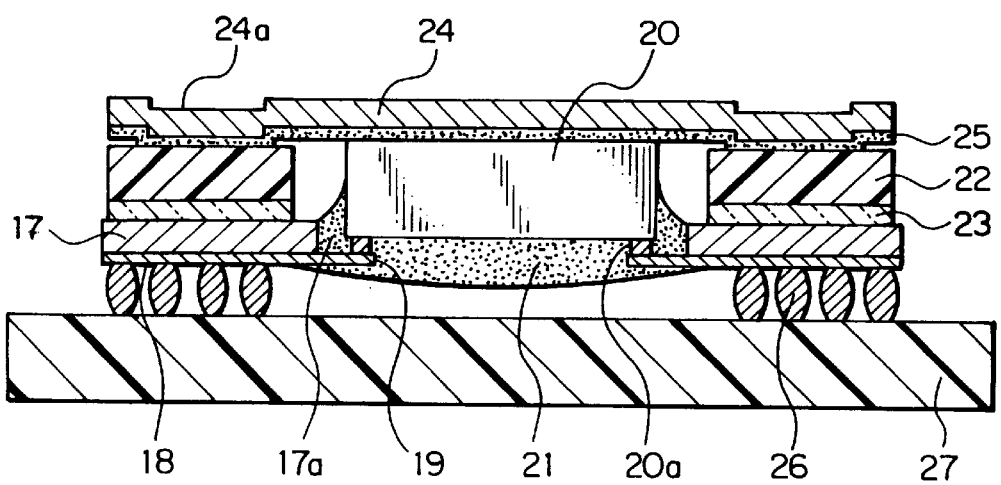
FIG. 1 is a sectional view showing the structure of a first embodiment of an electronic device of the present invention.

FIG. 1 is a sectional view showing the structure of principal portions of an electronic device according to a first embodiment of the present invention. In this embodiment, a tape-BGA type semiconductor package is mounted on a mother board.

In FIG. 1, reference numeral 17 is an insulating resin film. The insulating resin film 17 is composed of a polyimide resin film or the like. The insulating resin film 17 has a device hole 17a. Wirings 18 (for signal lines) and inner leads 19 are disposed on one main face (the lower face in FIG. 1). One edge portion of the inner leads 19 protrudes to the device hole 17a.

The other (rear) edge portion of the inner leads 19 is connected to the respective wirings 18. Connecting pads (not shown) as external connecting terminals are disposed at the other end of the wirings 18. A number of connecting pads are arranged in a grid pattern. A semiconductor element 20 is disposed with face down in the device hole 17a of the wiring film. Electrode pads (not shown) of the semiconductor element 20 are electrically connected to protruding edge portions of the relevant inner leads 19 with respective gold bumps 20a and so forth. An outer area of a connecting portion of the electrode pads of the semiconductor element 20 and the inner leads 19 is coated and sealed with a resin sealing layer 21. The resin sealing layer 21 protects and reinforces the semiconductor element 20. The resin sealing layer 21 is composed of epoxy resin or the like.

A frame type shape-holding plate (stiffener) 22 is adhered to a region that surrounds the device hole 17a on the opposite face of the wire forming face of the insulating resin film 17 with an adhesive agent layer 23. The stiffener 22 is composed of a metal having TEC of $13 \times 10^{-6}$ to $17 \times 10^{-6}$/K. Examples of the material of the shape-holding plate 22 is SUS 310S (having TEC of $15.9 \times 10^{-6}$/K) and CDA alloy C15150 (having TEC of $16.7 \times 10^{-6}$/K). The adhesive agent layer 23 is composed of thermoplastic resin, for example polyester. A plate-shaped cover (cover plate) 24 is disposed on the upper face of the stiffener 22 and the upper face (the opposite face of the electrode pads forming face) of the semiconductor element 20. The cover plate 24 is composed of a metal such as copper or aluminum that has a heat radiating characteristic. The cover plate 24 is adhered with an adhesive agent layer 25 composed of for example polyester. The cover plate 24 is fully adhered on the upper face of the semiconductor element 20. On the other hand, the cover plate 24 is adhered to only a concave portion 24a on the upper face of the stiffener 22. The concave portion 24a protrudes downward.

In addition, ball-shaped solder bumps 26 are disposed on the external connecting terminals (connecting pads) of the wiring film. In such a structure, a semiconductor package is accomplished.

Reference numeral 27 is a glass-epoxy wiring substrate as a mother board. Connecting pads (not shown) are disposed on one main face (the upper face in FIG. 1). The semiconductor package is mounted on the glass-epoxy wiring substrate 27. The connecting pads of the semiconductor package and the connecting pads of the glass-epoxy wiring substrate 27 are electrically and mechanically connected with the solder bumps 26.

In the electronic device according to the first embodiment, the stiffener 22 is composed of a metal having TEC of 13×10⁻⁶ to 17×10⁻⁶/K. Examples of the metal are SUS 310S and CDA Alloy C15150. Since TEC of the entire semiconductor package is close to TEC of the glass-epoxy wiring substrate 27 as the mother board, when a thermal load is periodically applied thereto, the distortion of the solder bumps 26 that connect the semiconductor package and the mother board is as small as 3%. Thus, the connecting portions have high reliability.

Figure 2:
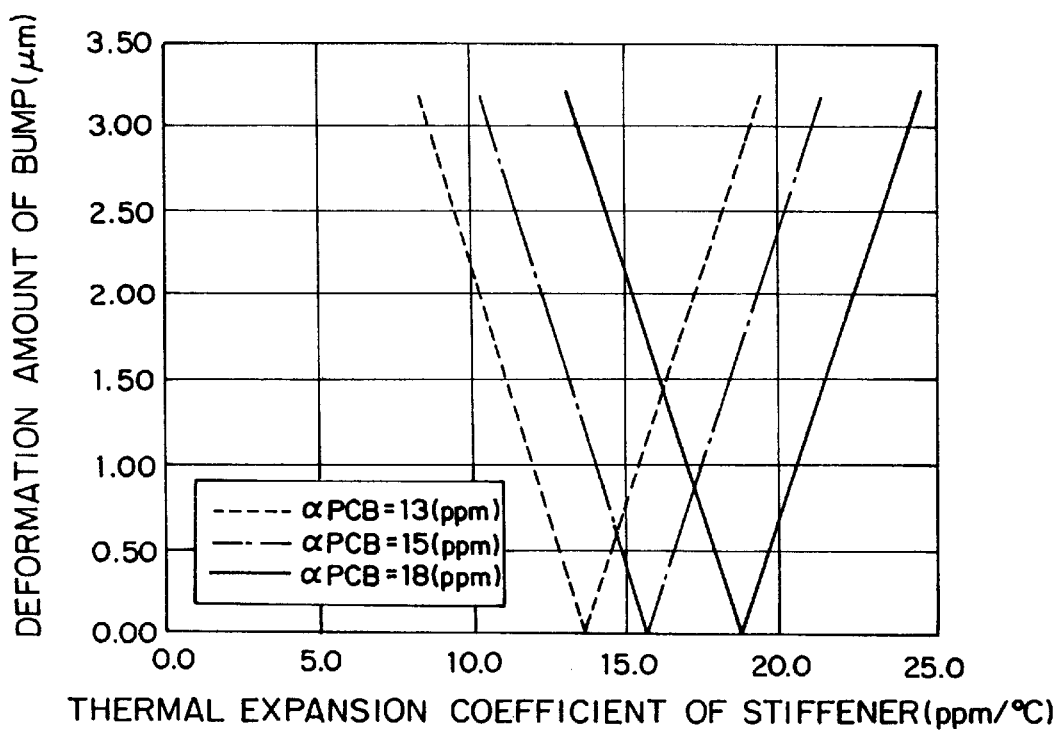
FIG. 2 is a graph showing results of temperature cycle tests as simulations of which various stiffeners for the electronic device shown in FIG. 1 are composed of metals with various TECs.

To clarify practical effects of the electronic device, temperature cycle tests (−65° C. to 120° C.) were undergone as simulations of which various stiffeners for the electronic device shown in FIG. 1 were composed of metals with various TECs. Temperature cycle tests (at −65° C. for 30 minutes and at 120° C. for 30 minutes) were undergone for electronic devices of which semiconductor packages (size: 35 μm×35 μm) with respective stiffeners composed of materials having various TECs were mounted on various glass-epoxy wiring substrates having TECs(α) of 13×10⁻⁶/K (13 ppm/K), 15 ppm/K, and 18 ppm/K in the conditions that the thickness of each stiffener was 250 μm and the thickness of each adhesive agent layer was 100 μm so as to obtain the deformation of the solder bumps. FIG. 2 shows the results of the temperature cycle tests.

Thus, in the electronic device with the stiffener composed of metal (such as SUS 310S or CDA alloy C15150) having TEC of 13 to 17 ppm/K, regardless of TEC of the glass-epoxy wiring substrate as a mother board is 13 ppm/K, 15 ppm/K, or 18 ppm/K, the deformation of the solder bumps is much smaller than that of a conventional electronic device with a stiffener composed of a metal having TEC of 17 ppm/K or more (SUS 304). Thus, it is clear that the electronic device according to the embodiment can withstand temperature cycles several to 10 times larger than the conventional electronic device.

When the number of cycles of the temperature cycle tests (−65° C. to 120° C.) exceeded 1000 in the electronic device with the stiffener composed of CDA Alloy C15150, no fatigue breakdown was caused in the solder bumps. Thus, it is clear that the solder bumps secure high reliable connections.

In the semiconductor package according to the first embodiment, as a rigid material that composes a stiffener, a metal is used. The metal is superior to other rigid materials (for example, ceramics) in thermal conductivity, heat radiation, formability, workability, and flatness. Thus, the metal can be easily bent and sheared. Even if the metal skews or warps, it can be easily flattened. Thus, a stiffener with high flatness can be easily formed. Consequently, a semiconductor package with high heat radiation can be obtained.

Table 1 shows comparisons of characteristics of a metal (for example, CDA Alloy C15150) and ceramics (for example, aluminum oxide) as rigid materials of the stiffener 24.

TABLE 1

| | Embodiment | Compared example |
|---|---|---|
| Material of stiffener | CDA Alloy C15150 | Aluminum oxide |
| Thermal expansion coefficient (ppm/° C) | 16.7 | 7.0 |
| Heat radiation - Thermal conductivity (W m/K) | 373 | 15 to 20 |

TABLE 1-continued

| | Embodiment | Compared example |
|---|---|---|
| Formability and workability | Good (easily bent) | Cut edge face is subject to cracking. Can not be formed in cap shape. |
| Flatness | Good. Easily flattened. | No good. Subject to be skewed or warped. Difficult to be flattened. |

Next, a second embodiment of the present invention will be described.
(Embodiment 2)

Figure 3:
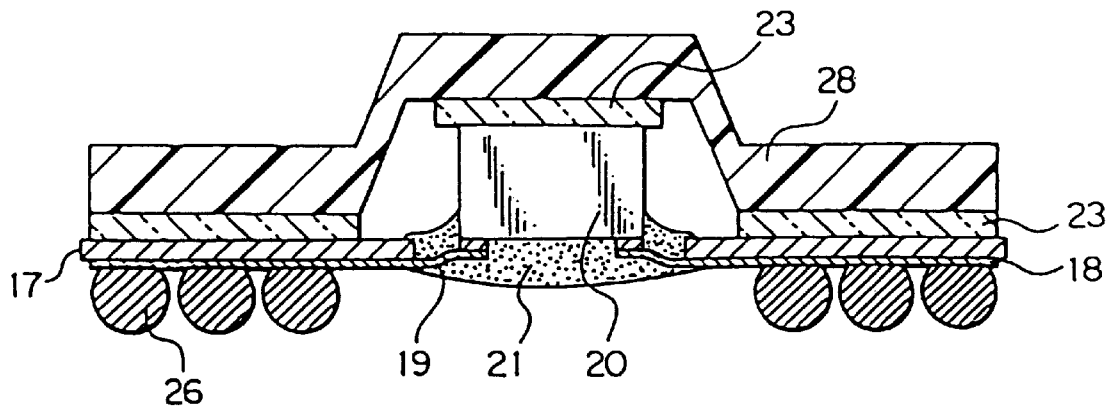
FIG. 3 is a sectional view showing the structure of a second embodiment of a semiconductor package of the present invention.
Figure 4:
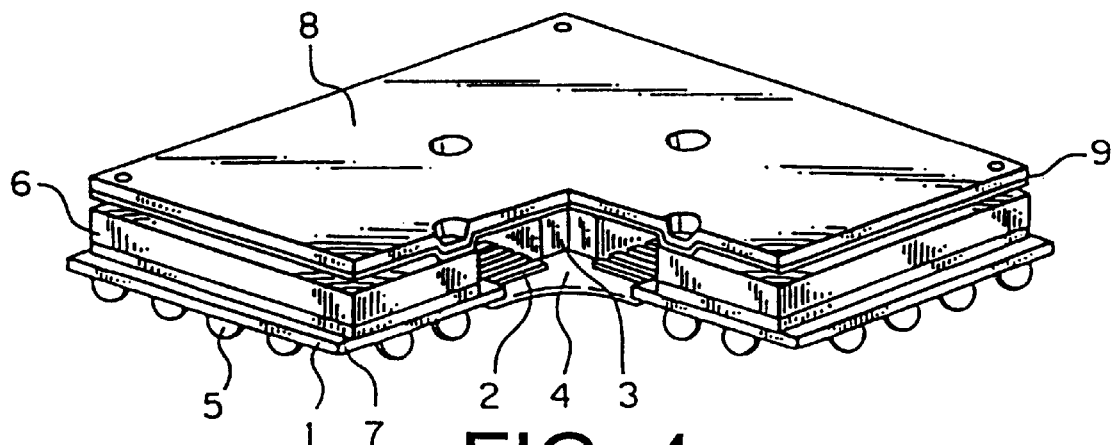
FIG. 4 is a perspective view showing the structure of a conventional tape-BGA type semiconductor package.
Figure 5:
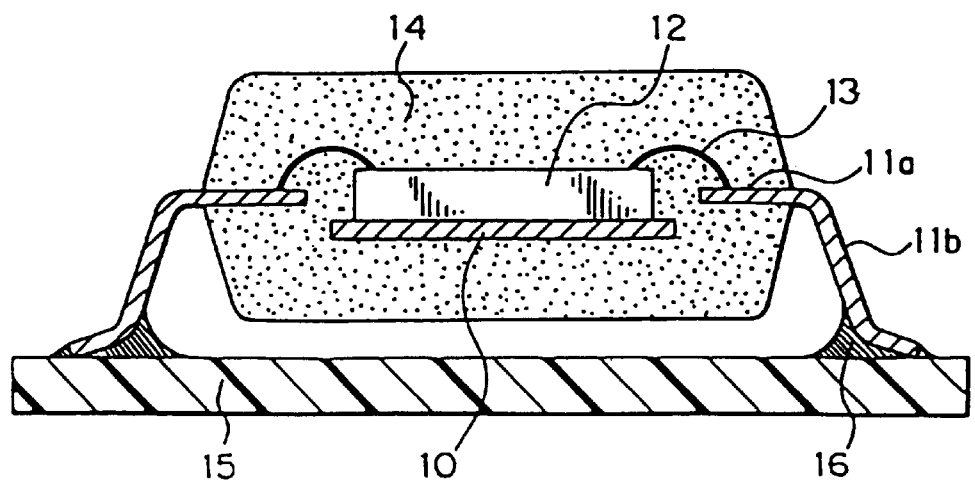
FIG. 5 is a sectional view showing an electronic device of which a QFP is mounted on a mother board.

FIG. 3 shows principal portions of a semiconductor package according to a second embodiment of the present invention. In FIG. 3, similar parts to those in FIG. 1 are denoted by similar reference numerals. A heat radiating cap (stiffener unified heat radiating cap) 28 that has a shape-holding characteristic is disposed on a semiconductor element 20 and an insulating film 17. The heat radiating cap 28 is adhered to the upper face of the semiconductor element 20 and the insulating film 17 with an adhesive agent layer 23 composed of for example polyester. The stiffener unified heat radiating cap 28 is composed of a metal having TEC of 13×10⁻⁶ to 17×10⁻⁶/K. Examples of the material of the heat radiating cap 28 is SUS 310S and CDA Alloy C15150.

In this embodiment, the semiconductor package is mounted on a glass-epoxy wiring substrate 27, and predetermined terminals are connected with solder bumps 26. Thus, they can be connected with high reliability. In other words, in the electronic device of which the external connecting terminals (connecting pads) of the semiconductor package are electrically and mechanically connected to connecting pads of the glass-epoxy wiring substrate 27 as a mother board with the solder bumps 26, even if a thermal load is cyclically applied to the solder bumps 26, stress does not concentrate at the solder bumps 26. Thus, the solder bumps 26 are suppressed from distorting. Consequently, the connections between the semiconductor package and the glass-epoxy wiring substrate 27 are secured with high reliability.

In the semiconductor package according to the second embodiment, instead of the structure of which both the stiffener and the heat radiation cover plate are disposed, the stiffener unified heat radiating cap 28 that has both functions of the stiffener and the heat radiation cover plate is disposed. In addition, since the stiffener unified heat radiating cap 28 is composed of a metal such as SUS 310S or CDA Alloy C15150, the thickness of the semiconductor package and the thickness of the electronic device that has the semiconductor package can be decreased. Moreover, the heat radiating cap can be easily formed. Thus, the fabrication process can be simplified. In addition, the number of parts can be reduced. Moreover, since the adhering areas of the stiffener unified heat radiating cap 28 and the insulating film 17 are large (in other words, the sectional area of a heat radiation path is large), the heat radiating characteristic is high and good.

It should be noted that the present invention is not limited to the semiconductor package and the electronic device according to the first and second embodiments. Instead, without departing from the spirit of the present invention, the semiconductor package and the electronic device may be modified in various manners. For example, the mother board may be a glass-polyamide wiring substrate or a glass-BT resin wiring substrate or a ceramic wiring substrate with an insulating base material such as aluminum oxide or aluminum nitride.

As described above, in the electronic device according to the present invention, as the structural material of the shape-holding plate or the covering member that has a shape-holding characteristic, a metal having TEC close to that of the mother board is used. TEC of the semiconductor package is almost close to that of the mother board. Thus, in the actual use, the thermal stress applied to the connecting portions due to cyclic thermal loads can be relieved.

Consequently, the connecting reliability of the semiconductor package and the mother board is improved.

Moreover, when the semiconductor package according to the present invention is mounted on the mother board, since stress due to the difference of TEC between the shape-holding plate or the covering member with a shape-holding characteristic and the mother board can be relieved, the distortion of bumps such as solder bumps that are the connecting portions can be suppressed. As a result, the fatigue breakdown can be prevented. Thus, the connecting reliability of the electronic device can be remarkably improved.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. An electronic device, comprising:
   a wiring substrate having connecting terminals formed on one main face thereof:
   a semiconductor package having:
      a wiring film having a device hole, external connecting terminals, and inner leads, the external connecting terminals and the inner leads being formed on one face thereof,
      a semiconductor element disposed in the device hole and electrically connected to the inner leads, and
      a shape-holding plate composed of a metal having a thermal expansion coefficient almost close to that of the wiring substrate, the shape-holding plate being disposed in a region that surrounds the device hole on the other main face of the wiring film; and
   bumps for electrically and mechanically connecting the external connecting terminals of the semiconductor package and the connecting terminals of the wiring substrate,
   wherein the shape-holding plate is composed of 25Cr-20Ni stainless steel or copper alloy containing 0.01 to 0.03% by weight of Zr.

2. The electronic device as set forth in claim 1, wherein the bumps are Pb-Sn solder bumps.

3. The electronic device as set forth in claim 1, further comprising:
   a covering member disposed outside the semiconductor element of said semiconductor package.

4. The electronic device as set forth in claim 1,
   wherein the wiring substrate is a glass-epoxy wiring substrate of which glass cloths impregnated with epoxy resin and copper wiring layers are laminated, and
   wherein the shape-holding plate is composed of a metal having a thermal expansion coefficient of $13 \times 16^{-6}$ to $17 \times 10^{-6}$ (/K).

5. An electronic device, comprising:
   a wiring substrate having connecting terminals formed on one main face thereof;
   a semiconductor package having:
      a wiring film having a device hole, external connecting terminals, and inner leads, the external connecting terminals and the inner leads being formed on one face thereof,
      a semiconductor element disposed in the device hole and electrically connected to the inner leads, and
      a covering member having a shape-holding characteristic composed of a metal, the covering member having a thermal expansion coefficient almost closed to that of the wiring substrate, fully covering the outside of the semiconductor element, being adhered on the other main face of the wiring film; and
   bumps for electrically and mechanically connecting the external connecting materials terminals of the semiconductor package and the connecting terminals of the wiring substrate,
   wherein the covering member is composed of 25Cr-20Ni stainless steel or copper alloy containing 0.01 to 0.03% by weight of Zr.

6. The electronic device as set forth in claim 5, wherein the bumps are Pb-Sn solder bumps.

7. The electronic device as set forth in claim 5,
   wherein the wiring substrate is a glass-epoxy wiring substrate of which glass cloths impregnated with epoxy resin and copper wiring layers are laminated, and
   wherein the covering member is composed of a metal having a thermal expansion coefficient of $13 \times 16^{-6}$ to $17 \times 10^{-6}$ (/K).

8. A semiconductor package, comprising:
   a wiring film having a device hole, external connecting terminals, and inner leads, the external connecting terminals and the inner leads being formed on one face thereof;
   a semiconductor element disposed in the device hole and electrically connected to the inner leads; and
   a shape-holding plate composed of a metal having a thermal expansion coefficient of $13 \times 16^{-6}$ to $17 \times 10^{-6}$ (/K), the shape-holding plate being disposed in a region that surrounds the device hole on the other main face of the wiring film,
   wherein the shape-holding plate is composed of 25Cr-20Ni stainless steel or copper alloy containing 0.01 to 0.03% by weight of Zr.

9. The semiconductor package as set forth in claim 8,
   wherein Pb-Sn solder bumps are disposed on the external connecting terminals.

10. A semiconductor package, comprising:
    a wiring film having a device hole, external connecting terminals, and inner leads, the external connecting terminals and the inner leads being formed on one face thereof;
    a semiconductor element disposed in the device hole and electrically connected to the inner leads; and
    a covering member having a shape-holding characteristic composed of a metal, the covering member having a thermal expansion coefficient of $13 \times 16^{-6}$ to $17 \times 10^{-6}$ (/K), fully covering the outside of the semiconductor element, being adhered on the other main face of the wiring film,
    wherein the covering member is composed of 25Cr-20Ni stainless steal or copper alloy containing 0.01 to 0.03% by weight of Zr.

11. The semiconductor package as set forth in claim 10,
    wherein Pb-Sn solder bumps are disposed on the external connecting terminals.

* * * * *

UNITED STATES PATENT AND TRADEMARK OFFICE
CERTIFICATE OF CORRECTION

PATENT NO.: 6,097,085

DATED: August 1, 2000

INVENTOR(S): Ikemizu et al.

It is certified that an error appears in the above-identified patent and that said Letters Patent is hereby corrected as shown below:

Title page, item [57], line 4 of the Abstract, change "connect" to --connected to--.

*Claim 5, column 10, line 9, change "closed" to --close--.

Signed and Sealed this

Twenty-second Day of May, 2001

*Attest:*

NICHOLAS P. GODICI

*Attesting Officer*  Acting Director of the United States Patent and Trademark Office